US010256018B2

United States Patent
Matsumoto

(10) Patent No.: US 10,256,018 B2
(45) Date of Patent: Apr. 9, 2019

(54) CAST RARE EARTH-CONTAINING ALLOY SHEET, MANUFACTURING METHOD THEREFOR, AND SINTERED MAGNET

(71) Applicant: SANTOKU CORPORATION, Kobe-shi, Hyogo (JP)

(72) Inventor: Yasutomo Matsumoto, Kobe (JP)

(73) Assignee: SANTOKU CORPORATION, Kobe-shi (JP)

( * ) Notice: Subject to any disclaimer, the term of this patent is extended or adjusted under 35 U.S.C. 154(b) by 195 days.

(21) Appl. No.: 15/118,523

(22) PCT Filed: Feb. 12, 2015

(86) PCT No.: PCT/JP2015/053735
§ 371 (c)(1),
(2) Date: Aug. 12, 2016

(87) PCT Pub. No.: WO2015/122422
PCT Pub. Date: Aug. 20, 2015

(65) Prior Publication Data
US 2017/0221617 A1    Aug. 3, 2017

(30) Foreign Application Priority Data

Feb. 14, 2014  (JP) ................. 2014-026337
Jun. 10, 2014  (JP) ................. 2014-119390

(51) Int. Cl.
B22F 1/00    (2006.01)
B22F 3/16    (2006.01)
(Continued)

(52) U.S. Cl.
CPC ........... *H01F 1/0577* (2013.01); *B22D 11/06* (2013.01); *B22F 1/0055* (2013.01); *B22F 3/16* (2013.01);
(Continued)

(58) Field of Classification Search
CPC ........ H01L 1/0577; B22F 1/0055; B22F 9/04; B22F 2301/355; C21D 6/00; C21D 6/007;
(Continued)

(56) References Cited

U.S. PATENT DOCUMENTS

2006/0048855 A1   3/2006 Honkura et al.
2006/0213583 A1   9/2006 Nakamura et al.
(Continued)

FOREIGN PATENT DOCUMENTS

EP    1544870 A1    6/2005
JP    2005-175138 A  6/2005
(Continued)

OTHER PUBLICATIONS

Translation for WO 2012/013086, Feb. 2, 2012. (labled as CN 102347126 since CN 102347126 is Chinese equivalent to WO 2012/013086).*
(Continued)

*Primary Examiner* — C Melissa Koslow
(74) *Attorney, Agent, or Firm* — Sughrue Mion, PLLC

(57) ABSTRACT

Rare earth-containing alloy flakes and a sintered magnet made of the same are provided, which alloy flakes are useful in the production of sintered magnets of which Br and HcJ may be excellent and well-balanced according to the Dy and/or Tb content. The rare earth-containing alloy flakes are R-TM-A-M-type alloy flakes which have a particular composition, and a structure having a $Nd_2Fe_{14}B$ main phase and a boundary phase, the Fe content in the boundary phase is not more than 10 mass %, and a ratio of the total content (b) of Dy and Tb in the boundary phase to the total content (a) of Dy and Tb in the main phase is higher than 1.0, and are useful as a sintered magnet material.

8 Claims, 2 Drawing Sheets

(51) Int. Cl.

| | |
|---|---|
| *B22F 9/04* | (2006.01) |
| *B22F 9/08* | (2006.01) |
| *B22F 9/22* | (2006.01) |
| *C21D 6/00* | (2006.01) |
| *B22D 11/06* | (2006.01) |
| *C22C 38/00* | (2006.01) |
| *C22C 38/02* | (2006.01) |
| *C22C 38/06* | (2006.01) |
| *C22C 38/10* | (2006.01) |
| *C22C 38/16* | (2006.01) |
| *C22C 38/28* | (2006.01) |
| *C23C 10/20* | (2006.01) |
| *C23C 10/60* | (2006.01) |
| *C23C 16/06* | (2006.01) |
| *C23C 16/44* | (2006.01) |
| *H01F 1/057* | (2006.01) |
| *H01F 41/02* | (2006.01) |

(52) U.S. Cl.
CPC ................ *B22F 9/04* (2013.01); *B22F 9/08* (2013.01); *B22F 9/22* (2013.01); *C21D 6/007* (2013.01); *C21D 6/008* (2013.01); *C22C 38/002* (2013.01); *C22C 38/005* (2013.01); *C22C 38/02* (2013.01); *C22C 38/06* (2013.01); *C22C 38/10* (2013.01); *C22C 38/16* (2013.01); *C22C 38/28* (2013.01); *C23C 10/20* (2013.01); *C23C 10/60* (2013.01); *C23C 16/06* (2013.01); *C23C 16/4417* (2013.01); *H01F 41/0293* (2013.01); *B22F 2009/044* (2013.01); *B22F 2301/355* (2013.01); *B22F 2998/10* (2013.01)

(58) Field of Classification Search
CPC ....... C21D 6/008; C22C 38/005; C23C 10/20; C23C 10/60
See application file for complete search history.

(56) References Cited

U.S. PATENT DOCUMENTS

| | | |
|---|---|---|
| 2010/0003156 A1 | 1/2010 | Suzuki et al. |
| 2010/0129538 A1 | 5/2010 | Kunieda et al. |
| 2012/0032764 A1 | 2/2012 | Kuniyoshi |
| 2012/0187326 A1 | 7/2012 | Ozeki et al. |

FOREIGN PATENT DOCUMENTS

| | | | |
|---|---|---|---|
| JP | 2006-28602 A | | 2/2006 |
| JP | 2006-303433 A | | 11/2006 |
| JP | 2011-9495 A | | 1/2011 |
| JP | 2011-228665 A | | 11/2011 |
| JP | 2015-35455 A | | 2/2015 |
| WO | 2008/120784 A1 | | 10/2008 |
| WO | WO 2012/013086 | * | 2/2012 |

OTHER PUBLICATIONS

International Bureau of WIPO, International Preliminary Report on Patentability with translation of Written Opinion dated Aug. 25, 2016, issued in application No. PCT/JP2015/053735.
European Patent Office, Communication dated Oct. 2, 2017, issued in corresponding European application No. 15748811.5.
International Searching Authority International Search Report for PCT/JP2015/053735 dated Apr. 28, 2015.

* cited by examiner

CAST RARE EARTH-CONTAINING ALLOY SHEET, MANUFACTURING METHOD THEREFOR, AND SINTERED MAGNET

CROSS REFERENCE TO RELATED APPLICATIONS

This application is a National Stage of International Application No. PCT/JP2015/053735 filed Feb. 12, 2015, claiming priority based on Japanese Patent Application Nos. 2014-026337 filed Feb. 14, 2014 and 2014-119390 filed Jun. 10, 2014, the contents of all of which are incorporated herein by reference in their entirety.

FIELD OF ART

The present invention relates to rare earth-containing alloy flakes that are suitable for the production of sintered magnets having excellent and well-balanced magnetic remanence (Br) and coercivity (HcJ), as well as to a method for producing the alloy flakes and a sintered magnet utilizing the alloy flakes.

BACKGROUND ART

Rare earth-containing alloy sintered magnets containing $Nd_2Fe_{14}B$ as the main phase are known as the highest performance magnets among permanent magnets and used, for example, in various motors, such as voice coil motors in hard disk drives and motors for hybrid vehicles, and in consumer electric appliances.

Sintered magnets used in the field of automotive, which are generally required to have heat resistance, are required to have high coercive force for preventing high temperature demagnetization. Such high coercive force is imparted to the magnets of this type by optimum regulation of the structure of the main phase $Nd_2Fe_{14}B$ and the R-rich phase (boundary phase) present in the crystal grain boundaries between the main phase grains, and by containing about a few mass percent to 10 mass percent of Dy, which is rarer as natural resources and more expensive than Nd and Pr.

However, in general, the magnetic remanence (Br) and the coercivity (HcJ) are trading-off, so that increase in Dy content in a magnet for improving HcJ results in decrease in Br.

For suppressing decrease in Br while improving HcJ, it is effective to selectively distribute Dy or Tb, which has higher magnetic anisotropy than Nd or Pr, not in the main phase, but in the boundary phase.

Patent Publication 1 discloses that a magnet with high coercivity is obtained by forming a Dy and/or Tb layer by sputtering over a sintered rare earth magnet, followed by heat treatment, to thereby distribute Dy and/or Tb at a high concentration in the boundary phase on the surface of a rare earth magnet.

Patent Publications 2 and 3 disclose that the effect similar to that disclosed in Patent Publication 1 may be achieved by adhering a fluoride or hydride of Dy or Tb to the surface of a sintered rare earth magnet, followed by heat treatment.

Patent Publication 1: JP-2005-175138-A
Patent Publication 2: JP-2006-303433-A
Patent Publication 3: WO 2008/120784

SUMMARY OF THE INVENTION

Problems to be Solved by the Invention

By the methods disclosed in Patent Publications 1 to 3, however, Dy and Tb are rich only near the surface of a rare earth magnet sintered body, and hard to be distributed at a high concentration throughout the boundary phase.

Further, there have not been known unsintered, rare earth-containing alloy flakes having the $Nd_2Fe_{14}B$ main phase, in which Dy and Tb are contained at a higher concentration in the boundary phase than in the main phase.

It is an object of the present invention to provide rare earth-containing alloy flakes useful in the production of sintered magnets of which Br and HcJ may be excellent and well-balanced according to the Dy and/or Tb content, as well as a sintered magnet utilizing the alloy flakes.

It is another object of the present invention to provide a method for producing rare earth-containing alloy flakes which allows ready and convenient production of rare earth-containing alloy flakes containing Dy and Tb at a higher concentration in the boundary phase than in the main phase.

Means for Solving the Problem

The present inventor has made intensive researches to find out that the above-mentioned problems may be solved by, in the production of rare earth-containing alloy flakes having the $Nd_2Fe_{14}B$ main phase, contacting at least one of a Dy supply source and a Tb supply source to master alloy flakes in which the Fe content in the boundary phase is reduced, followed by heat treatment, to thereby complete the present invention.

According to the present invention, there are provided R-TM-A-M-type rare earth-containing alloy flakes of a composition consisting of:

not less than 27.0 mass % and not more than 40.0 mass % R representing at least two elements selected from the group consisting of Y, Sc, and lanthanoid elements of atomic numbers 57 to 71, with Nd and at least one of Dy and Tb being essential;

not less than 0.7 mass % and not more than 2.0 mass % A representing B, or B and C;

not less than 0 mass % and not more than 3.0 mass % M representing at least one element selected from the group consisting of Al, Si, Ti, V, Cr, Mn, Ni, Cu, Zn, Ga, Zr, Nb, Mo, Ag, In, Sn, Hf, Ta, W, Pb, and Bi; and a balance TM representing Fe, or Fe and Co;

wherein a content of Dy and Tb in R is not less than 0.1 mass % and not more than 10.0 mass %, wherein said alloy flakes have a structure having a $Nd_2Fe_{14}B$ main phase and a boundary phase, wherein a Fe content in said boundary phase is not more than 10 mass %, and wherein a ratio of a total content (b) of Dy and Tb in said boundary phase to a total content (a) of Dy and Tb in said main phase is higher than 1.0 (sometimes referred to as the present alloy flakes hereinbelow).

According to the present invention, there is also provided a method for producing the present alloy flakes, said method comprising the steps of:

(I) melting a raw material consisting of R' selected from the group consisting of Y, Sc, and lanthanoid elements of atomic numbers 57 to 64 and 67 to 71, with Nd being essential: A representing B, or B and C: M representing at least one element selected from the group consisting of Al, Si, Ti, V, Cr, Mn, Ni, Cu, Zn, Ga, Zr, Nb, Mo, Ag, In, Sn, Hf, Ta, W, Pb, and Bi: and TM representing Fe, or Fe and Co;

(II) cooling and solidifying a melt of said raw material for preparing a precursor of master alloy flakes;

(III) heat-treating said precursor of master alloy flakes obtained from step (II) for obtaining master alloy flakes;

(IV) contacting at least one of a Dy supply source and a Tb supply source to said master alloy flakes; and (V) heat-treating, after said step (IV), for dispersing at least one of Dy and Tb in said master alloy flakes.

According to the present invention, there is further provided a sintered magnet obtained by sintering a molded product of pulverized present alloy flakes.

Effect of the Invention

The present alloy flakes, which have the particular alloy composition and the structure as discussed above, and the regulated content of Dy and/or Tb in the boundary phase and in the main phase, are useful in the production of sintered magnets having excellent and well-balanced Br and HcJ, according to the content of Dy and/or Tb.

The production method according to the present invention, which includes step (III) yielding a master alloy having a reduced Fe content in the boundary phase, and step (V) of heat-treating after step (IV), allows convenient and ready production of the present alloy flakes in which Dy and Tb are contained at a higher concentration in the boundary phase than in the main phase.

EMBODIMENTS OF THE INVENTION

Figure 1:
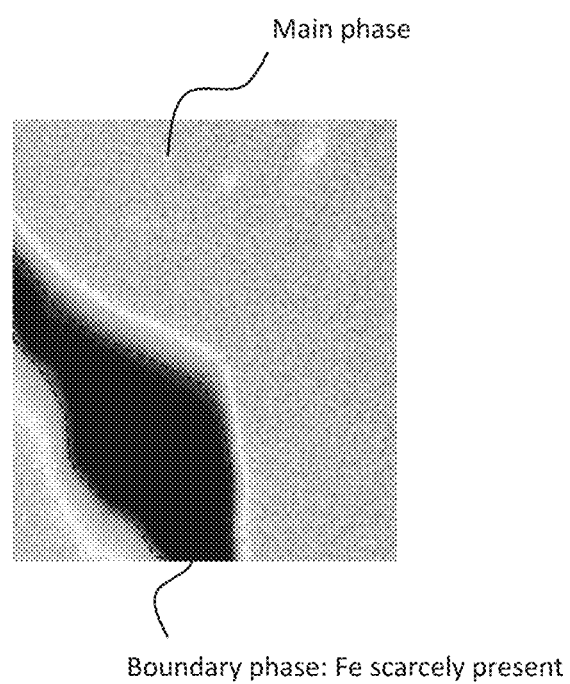
FIG. 1 is a photocopy of a mapping image showing how Fe is present in the alloy flakes of the present invention prepared in Example 1.

The present invention will now be explained in detail.

The R-TM-A-M-type rare earth-containing alloy flakes according to the present invention are characterized by the particular composition, the structure having the tetragonal $Nd_2Fe_{14}B$ main phase and the boundary phase with a higher content of rare earth elements than the main phase, and the higher Dy or Tb content in the boundary phase than in the main phase. Incidentally, the present alloy flakes are unsintered and, when used as a raw material for sintered magnets, for example, need to be sintered in the production of magnets. Thus, the present alloy flakes are clearly distinguished from the unheat-treated, magnet sintered body to which surface Dy and/or Tb is contacted, disclosed in Patent Publications 1 to 3.

In the R-TM-A-M-type present alloy flakes, R is at least two elements selected from the group consisting of Y, Sc, and lanthanoid elements of atomic numbers 57 to 71, and essentially includes Nd and at least one of Dy and Tb. The lanthanoid elements of atomic numbers 57 to 71 are La, Ce, Pr, Nd, Pm, Sm, Eu, Gd, Tb, Dy, Ho, Er, Tm, Yb, and Lu.

In the present alloy, the content of R is not less than 27.0 mass % and not more than 40.0 mass %, and the minimum content is preferably 28.0 mass % and the maximum content is preferably 35.0 mass %, more preferably 33.0 mass %. At less than 27.0 mass %, the a-Fe content in the alloy flakes may be high. At more than 40.0 mass %, the Br of a sintered magnet made of the alloy flakes may be low.

The total content of Dy and Tb, at least one of which is an essential element, in R is preferably not less than 0.1 mass % and not more than 10 mass %, more preferably not less than 0.3 mass % and not more than 8.0 mass %, most preferably not less than 0.3 mass % and not more than 7.0 mass %. As will be discussed later, it is preferred that as much Dy and Tb as possible are segregated in the boundary phase, but at more than 10 mass %, Dy and Tb may be incorporated also in the main phase to deteriorate the magnet performance of the sintered magnet made of the alloy flakes. At less than 0.1 mass %, the effect of improving the magnet performance may not be achieved.

The content of Nd, which is an essential element in R, is preferably not less than 9.0 mass % and not more than 39.9 mass %, more preferably not less than 9.0 mass % and not more than 39.7 mass %.

In the present alloy flakes, A is B, or B and C. When A includes C, the number of C atoms is preferably smaller than that of B atoms.

In the present alloy flakes, the content of A is not less than 0.7 mass % and not more than 2.0 mass %, and the maximum content is preferably 1.5 mass %, more preferably 1.2 mass %, most preferably 1.0 mass %. With the content of A outside the above-mentioned range, the magnet performance of the sintered magnet made of the alloy flakes may be poor.

When the number of C atoms is larger than that of B atoms, a large amount of carbides are formed in the sintered magnet made of the alloy flakes, to lower the Br.

In the present alloy flakes, M is at least one element selected from the group consisting of Al, Si, Ti, V, Cr, Mn, Ni, Cu, Zn, Ga, Zr, Nb, Mo, Ag, In, Sn, Hf, Ta, W, Pb, and Bi.

The content of M in the present alloy flakes is not less than 0 mass % and not more than 3.0 mass %. For improving the magnetic property and physical properties of a sintered magnet made of the alloy flakes, this M content range is favorable.

M is preferably at least one element selected from Al, Cu, and Si, and particularly preferably includes Si for remarkably improving dispersion and distribution of Dy and/or Tb in the boundary phase and remarkably improving HcJ. In this case, the content of Si is preferably not less than 0.1 mass %.

In the present alloy flakes, TM is Fe, or Fe and Co.

The content of TM in the present alloy flakes is the balance left after subtracting the total amount of R, A, M and inevitable components from 100 mass %.

When TM includes Co, the content of Co is preferably not less than 0.10 mass % and not more than 5.00 mass %.

The structure of the present alloy flakes has a tetragonal $Nd_2Fe_{14}B$ main phase and a boundary phase having a higher content of rare earth elements than the main phase. A trace amount of other phases inevitably formed may optionally be contained.

In the present alloy flakes, the Fe content in the boundary phase is not more than 10 mass %, preferably not more than 5 mass %. The minimum Fe content in the boundary phase is preferably as small as possible for retaining Dy and/or Tb in the boundary phase, and is usually about 1.00 mass %.

In the present alloy flakes, the ratio of total amount (b) of Dy and Tb in the boundary phase to the total amount (a) of Dy and Tb in the main phase, i.e., (b)/(a), is higher than 1.0, preferably not lower than 10.0. With (b)/(a) of not higher than 1.0, the effect of the present invention of excellent and well-balanced Br and HcJ according to the Dy and/or Tb content may not be achieved.

The present alloy flakes have an average thickness of preferably not thinner than 0.01 mm and not thicker than 5.0 mm. At over 5.0 mm, the desired structure may not be attained.

The present alloy flakes may be obtained, for example, by the production method of the present invention, but is not limited thereto.

The production method of the present invention includes step (I) of melting a raw material consisting of R' selected from the group consisting of Y, Sc, and lanthanoid elements of atomic numbers 57 to 64 and 67 to 71, with Nd being essential: A representing B, or B and C: M representing at least one element selected from the group consisting of Al, Si, Ti, V, Cr, Mn, Ni, Cu, Zn, Ga, Zr, Nb, Mo, Ag, In, Sn, Hf, Ta, W, Pb, and Bi: and TM representing Fe, or Fe and Co.

The respective contents of R', TM, A, and M in step (I) may suitably be decided to achieve the respective content ranges of R, TM, A, and M in the present alloy flakes discussed above.

The raw material may be melted in a conventionally known manner, for example, in a crucible in an inert gas atmosphere, such as Ar atmosphere, usually under reduced or atmospheric pressure, preferably at 1400 to 1600° C.

The production method of the present invention includes step (II) of cooling and solidifying a melt of the raw material for preparing a precursor of master alloy flakes.

The cooling and solidifying may be performed, for example, by strip casting, such as conventionally-known single-roll rapid quenching. Slow quenching in a mold is not preferred since the primary phase a-Fe is formed.

The thickness of the precursor of master alloy flakes obtained from step (II) is preferably not thinner than 0.01 mm and not thicker than 5.0 mm.

The precursor of master alloy flakes usually has an alloy structure containing a smaller amount of main phase and a larger amount of boundary phase, since the boundary phase is solidified in a nonequilibrium state, with unprecipitated main phase left therein. This boundary phase contains one of the main phase components, Fe, in a large amount, usually larger than about 25 mass %. Presence of a large amount of Fe in the boundary phase interferes with presence of heavy rare earths, such as Dy and Tb, which contribute to improvement of magnet performance, in the boundary phase at a higher ratio. This is because Dy and Tb have higher affinity to Fe than to Nd, and migrate with Fe from the boundary phase to the main phase in step (IV) to be discussed later. This results in higher HcJ but disadvantageously lower Br. In view of this, in the production method of the present invention, subsequent step (III) is performed.

The production method according to the present invention includes step (III) of heat-treating the precursor of master alloy flakes obtained from step (II) for obtaining mater alloy flakes.

In step (III), the heat treatment may be carried out under the conditions to cause migration of Fe in the boundary phase to the main phase to reduce the Fe content in the boundary phase in the precursor of master alloy flakes obtained from step (II). Specific example of the heat treatment conditions may be usually at not lower than 500° C. and not higher than 1000° C., preferably not lower than 700° C. and not higher than 900° C., usually for 1 minute to 20 hours, preferably for 10 minutes to 10 hours. At lower than 500° C., it takes a long time for Fe to migrate from the boundary phase to the main phase, which is not preferred, whereas at over 1000° C., the Fe content in the boundary phase is hard to regulate, which is not preferred.

The atmosphere is preferably of inert gas, such as rare gas, or vacuum. The manner of the heat treatment may be, for example, electric heating, or high-frequency or infrared heating.

In the master alloy flakes obtained from step (III), it is preferred that the Fe content in the boundary phase is usually not higher than 10 mass %.

The production method according to the present invention includes step (IV) of contacting at least one of a Dy supply source and a Tb supply source to the master alloy flakes.

The Dy supply source or the Tb supply source may be, for example, Dy metal; Tb metal; halides of Dy or Tb, such as chlorides or fluorides, e.g., $DyF_3$ or $TbF_3$; oxides of Dy or Tb, such as $Dy_2O_3$ or $Tb_2O_3$; oxyfluorides of Dy or Tb; carbonates of Dy or Tb; organic acid salts of Dy or Tb such as oxalates or acetates; or hydrides of Dy or Tb, such as $DyH_2$ or $TbH_2$.

The contact of the Dy supply source and/or the Tb supply source to the master alloy flakes may be effected by a conventionally-known manner. It is preferred that the amount to be contacted to the master alloy flakes is suitably decided so that the total amount of Dy and Tb in R in the resulting present alloy flakes is not less than 0.1 mass % and not more than 10.0 mass %.

The production method according to the present invention includes step (V) of heat treating, after step (IV), for dispersing at least one of Dy and Tb in the master alloy flakes.

In step (V), the Dy and/or Tb contacted in step (IV) is dispersed in the boundary phase of the master alloy. This is because, in the master alloy, the melting point is lower in the boundary phase than in the main phase, so that Dy and/or Tb is easier to be incorporated into the boundary phase.

In step (V), the temperature of the heat treatment is preferably not lower than 500° C. and not higher than 1000° C., more preferably not lower than 700° C. and not higher than 900° C. At lower than 500° C., it takes disadvantageously a long time for Dy and/or Tb to disperse in the boundary phase, whereas at over 1000° C., the boundary phase may be liquefied and segregated, the main phase is coarsened, or even the alloy per se may be molten depending on its composition.

The duration of the heat treatment may be selected suitably, taking into account the manner of heating, the atmosphere, the heat treatment temperature, or the like factors, and preferably from 1 minute to 20 hours, more preferably from 10 minutes to 10 hours.

The atmosphere of the heat treatment is preferably of an inert gas, such as rare gas, or vacuum. The manner of the heating is not particularly limited as long as the alloy may be heated to a desired temperature, and may be, for example, electric heating, or high-frequency or infrared heating.

The sintered magnet according to the present invention maybe obtained by sintering a molded product of pulverized present alloy flakes.

Specifically, the sintered magnet may be obtained by, for example, pulverizing the present alloy flakes into a desired particle size by a conventionally-known manner, such as hydrogen decrepitation or mechanical pulverization, preparing a molded product of a desired shape under pressure, and sintering the obtained molded product in a desired magnetic field.

The sintering may be carried out under conventionally-known conditions, for example, by heating in an atmosphere of an inert gas, such as rare gas, or vacuum, at not lower than 1050° C. for 1 to 10 hours.

After the sintering, a conventionally-known heat treatment may preferably be carried out for homogenization.

EXAMPLES

The present invention will now be explained in more detail with reference to Examples and Comparative Examples, which do not intend to limit the present invention.

Example 1

1. Preparation of Precursor of Mater Alloy Flakes

A raw material was prepared to have the composition shown in Table 1, melted in a high-frequency furnace (manufactured by SANTOKU CORPORATION), and strip-casted to obtain a precursor of R-TM-A-M-type master alloy. Specifically, the raw material was introduced into an alumina crucible, and melted in a high-frequency furnace. The casting conditions were as follows. First, the melting of the raw material was effected at 1500° C. in an Ar atmosphere at 0.5 atm, and then the resulting melt was cooled and solidified into thin flakes by strip casting with a water-cooled copper roll, to thereby obtain a precursor of master alloy flakes. The average thickness of the precursor of master alloy was about 300 μm. The composition of the raw material of the precursor of master alloy flakes is shown in Table 1.

2. Preparation of Master Alloy Flakes

The obtained precursor of master alloy flakes was heat-treated at 900° C. in an Ar atmosphere at 1 atm for 5 hours to obtain master alloy flakes. Here, the heat treatment was performed in a heat treatment apparatus (SVSGgr20/20™ manufactured by SHIMADZU MECTEM, INC.), The conditions of the heat treatment of the precursor of master alloy flakes are shown in Table 2.

3. Dy and/or Tb Dispersing Heat Treatment

The obtained master alloy flakes was immersed in a 10 wt % ethanol solution of $DyF_3$ for 10 minutes, and ethanol was removed by vacuum drying to coat the surface of the master alloy flakes with $DyF_3$.

Then, the master alloy flakes coated with $DyF_3$ were heat-treated at 900° C. in an Ar atmosphere at 1 atm for 3 hours to disperse Dy in the boundary phase, to thereby obtain R-TM-A-M-type alloy flakes of Example 1. This treatment was also performed in the heat treatment apparatus discussed in Process 2 above.

The conditions of dispersing heat treatment are shown in Table 2. The composition of the R-TM-A-M-type alloy flakes of Example 1 and the Fe content in the boundary phase are shown in Table 3. Further, the ratio (b)/(a) of the content (b) of Dy+Tb in the boundary phase to the content (a) of Dy+Tb in the main phase is also shown in Table 3.

Here, the content of each element shown in Table 3 was determined by WDS (Wavelength Dispersive X-ray Spectroscopy) using JXA-8530F field emission electron probe micro-analyzer manufactured by JOEL LTD, and ZAF determination. The result is shown in FIG. 1, which is a photocopy of an image showing how Fe is present in the alloy flakes of the present invention prepared in Example 1. In FIG. 1, the black portion indicates that Fe is scarcely present.

4. Preparation of Sintered Magnet

The obtained R-TM-A-M-type alloy flakes were hydrogen-decrepitated at room temperature in a hydrogen atmosphere at 1 atm for 3 hours. Then the resulting hydrogen-decrepitated powder was further pulverized in nitrogen gas in a jet mill at 0.5 MPa to obtain alloy powder having a mean particle diameter D50 of 5.0 μm. Here, D50 is the median size, and measured with a laser diffraction particle size analyzer equipped with a dispersion unit (HELOS & RODOS™-T4.1 manufactured by SYMPATEC GMBH).

Using CM-5S manufactured by COSMO ENGINEERING CO., LTD., 5 g of the obtained alloy powder was pressure-molded under the pressure of 2 t/cm² in the magnetic field of 1.5 T (tesla) to obtain a rectangular parallelepiped molded product. Next, the molded product was sintered in vacuum at 1050° C. for 4 hours, and then aged in vacuum at 500° C. for 1 hour, to thereby obtain a rectangular parallelepiped sintered magnet.

5. Evaluation of Magnet Performance

The obtained sintered magnet was measured for Br and HcJ with TRF-5BH-25auto manufactured by TOEI INDUSTRY CO., LTD. The results are shown in Table 4.

Examples 2, 6, 7, 9, and 10

Master alloy flakes, R-TM-A-M-type alloy flakes, and a sintered magnet were prepared in the same way as in Example 1, except that the composition of the raw material of the precursor of master alloy flakes was changed as shown in Table 1, the heat treatment conditions for the precursor of master alloy flakes, the Dy or Tb supply source, and the conditions of the dispersing heat treatment were as shown in Table 2, and the manner of contacting Dy or Tb to the master alloy flakes was changed to vapor deposition discussed below. The results of the measurements and evaluations conducted in the same way as in Example 1 are shown in Tables 3 and 4.

The vapor deposition was carried out by placing master alloy flakes and a Dy or Tb supply source in close proximity in heat treatment apparatus, heating to evaporate Dy or Tb from its supply source, and causing the evaporated metal to deposit on the mater alloy flakes.

Examples 3, 4, 5, 8, and 11

Master alloy flakes, R-TM-A-M-type alloy flakes, and a sintered magnet were prepared in the same way as in Example 1, except that the composition of the raw material of the precursor of master alloy flakes was changed as shown in Table 1, the heat treatment conditions for the precursor of master alloy flakes, the Dy or Tb supply source, and the conditions of the dispersing heat treatment were as shown in Table 2. The results of the measurements and evaluations conducted in the same way as in Example 1 are shown in Tables 3 and 4.

In all of the Examples, the Fe content in the boundary phase of the R-TM-A-M-type alloy flakes was not higher than 4 mass %. However, the Fe content in the boundary phase of the precursor of master alloy flakes was 30 to 35 mass %, which is comparable to those in Comparative Examples shown in Table 3, because the content was measured before the heat treatment.

Comparative Example 1

Figure 2:
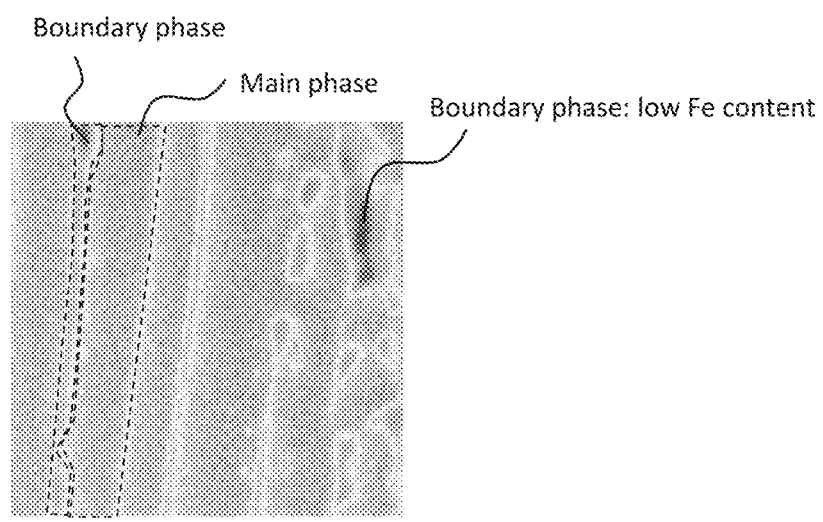
FIG. 2 is a photocopy of a mapping image showing how Fe is present in the sintered magnet prepared in Comparative Example 1.

A sintered magnet was prepared by preparing a precursor of master alloy flakes in the same way as in Example 1, and then subjecting the resulting precursor to the process described in Process 4 discussed above. Then, the obtained sintered magnet was subjected to the dispersion heat treatment described in Process 3 above. The resulting sintered magnet was subjected to the WDS in the same way as in Example 1, and the result is shown in FIG. 2, which is a photocopy of an image showing how Fe is present in the sintered magnet prepared in Comparative Example 1. In FIG. 2, the black portion indicates that Fe is scarcely present. Then, the magnet performance was evaluated as described in Process 5 above. The results are shown in Table 4.

Comparative Examples 2 to 4

Two kinds of precursors of master alloy flakes were prepared in the same way as in Example 1 using two raw materials of the compositions respectively shown in a pair of upper and lower rows in Table 1. Then the obtained precursors of master alloy flakes of the respective compositions of the upper and lower rows were mixed at a mass ratio of 95:5 in Comparative Examples 2 and 4, and at 90:10 in Comparative Example 3, and a sintered magnet was prepared according to the process described in Process 4 above.

The obtained sintered magnet was evaluated for magnet performance according to the process described in Process 5 above. The results are shown in Table 4.

Comparative Example 5

R-TM-A-M-type alloy flakes shown in Table 3 was prepared in the same way as in Example 1, except that master alloy flakes was not prepared according to Process 2 above, but the precursor of master alloy flakes was used as the master alloy flakes, then a sintered magnet was prepared from the alloy flakes in the same way as in Example 1, and the magnet performance was evaluated. The results are shown in Table 4.

TABLE 1

| | Composition of raw material of precursor of master alloy flakes (mass %) | | | | | | | | |
|---|---|---|---|---|---|---|---|---|---|
| | Nd | Pr | Dy | Fe | Co | B | Al | Cu | Si |
| Example 1 | 30.90 | 0.00 | 0.00 | Bal.*1 | 0.93 | 1.00 | 0.25 | 0.12 | 0.00 |
| Example 2 | 32.10 | 0.00 | 0.00 | Bal. | 4.00 | 1.14 | 0.11 | 0.41 | 0.00 |
| Example 3 | 30.20 | 0.00 | 0.00 | Bal. | 0.50 | 0.98 | 0.29 | 0.56 | 0.00 |
| Example 4 | 30.70 | 0.00 | 0.00 | Bal. | 1.13 | 0.95 | 0.35 | 0.24 | 0.00 |
| Example 5 | 32.50 | 0.00 | 0.00 | Bal. | 2.45 | 1.05 | 0.47 | 0.33 | 0.00 |
| Example 6 | 27.30 | 4.30 | 0.00 | Bal. | 3.37 | 1.01 | 0.52 | 0.28 | 0.00 |
| Example 7 | 23.90 | 6.20 | 0.00 | Bal. | 0.25 | 0.93 | 0.31 | 0.47 | 0.00 |
| Example 8 | 20.00 | 11.20 | 0.00 | Bal. | 1.86 | 1.08 | 0.16 | 0.15 | 0.00 |
| Example 9 | 15.50 | 13.90 | 0.00 | Bal. | 2.01 | 1.02 | 0.44 | 0.51 | 0.00 |
| Example 10 | 10.20 | 18.40 | 0.00 | Bal. | 1.36 | 1.18 | 0.56 | 0.39 | 0.00 |
| Example 11 | 29.10 | 5.00 | 0.00 | Bal. | 0.94 | 1.02 | 0.23 | 0.11 | 0.64 |
| Comparative Example 2 | 24.00 | 6.00 | 0.00 | Bal. | 0.00 | 1.00 | 0.20 | 0.00 | 0.00 |
| | 10.00 | 0.00 | 26.00 | Bal. | 10.00 | 0.00 | 0.50 | 2.00 | 0.00 |
| Comparative Example 3 | 29.00 | 0.00 | 0.00 | Bal. | 0.00 | 1.00 | 0.20 | 0.00 | 0.00 |
| | 5.00 | 0.00 | 26.00 | Bal. | 5.00 | 0.00 | 0.30 | 1.00 | 0.00 |
| Comparative Example 4 | 23.00 | 0.00 | 6.00 | Bal. | 0.50 | 1.00 | 0.20 | 0.00 | 0.00 |
| | 10.00 | 0.00 | 26.00 | Bal. | 0.00 | 0.00 | 0.50 | 2.00 | 0.00 |

*1Bal: balance (100 mass % − total mass % of other elements)

TABLE 2

| | Heat treatment of precursor of master alloy flakes | | | | Dispersing heat treatment | | | |
|---|---|---|---|---|---|---|---|---|
| | Temperature (° C.) | Pressure (atm) | Atmosphere | Duration (hr) | Supply source | Temperature (° C.) | Pressure (atm) | Atmosphere | Duration (hr) |
| Example 1 | 900 | 1 | Ar | 5 | DyF$_3$ | 900 | 1 | Ar | 3 |
| Example 2 | 900 | 1 | Ar | 10 | Dy | 800 | 0 | vacuum | 10 |
| Example 3 | 800 | 1 | Ar | 3 | Dy$_2$O$_3$ | 700 | 1 | Ar | 7 |
| Example 4 | 800 | 0 | vacuum | 7 | Tb$_2$O$_3$ | 900 | 0 | vacuum | 1 |
| Example 5 | 700 | 1 | Ar | 8 | TbF$_3$ | 900 | 0 | vacuum | 2 |
| Example 6 | 700 | 1 | Ar | 10 | Dy | 700 | 1 | Ar | 10 |
| Example 7 | 900 | 1 | Ar | 2 | DyFe | 800 | 1 | Ar | 2 |
| Example 8 | 900 | 0 | vacuum | 6 | DyF$_3$ | 900 | 0 | vacuum | 8 |
| Example 9 | 800 | 1 | Ar | 1 | Tb | 800 | 1 | Ar | 1 |
| Example 10 | 700 | 1 | Ar | 4 | Tb | 800 | 0 | vacuum | 5 |
| Example 11 | 900 | 1 | Ar | 3 | DyF$_3$ | 750 | 1 | Ar | 3 |
| Comparative Example 1 | not conducted | | | | DyF$_3$ | 900 | 1 | Ar | 3 |
| Comparative Example 2 | ditto | | | | not conducted | | | | |
| Comparative Example 3 | ditto | | | | ditto | | | | |
| Comparative Example 4 | ditto | | | | ditto | | | | |
| Comparative Example 5 | ditto | | | | DyF$_3$ | 900 | 1 | Ar | 3 |

TABLE 3

| | Composition of R-TM-A-M-type alloy flakes (mass %) | | | | | | | | | | Fe content in alloy flakes | |
|---|---|---|---|---|---|---|---|---|---|---|---|---|
| | R | | | | TM | | A | M | | | | |
| | Nd | Pr | Dy | Tb | Fe | Co | B | Al | Cu | Si | (mass %) | (b)/(a)*² |
| Example 1 | 27.40 | 0.00 | 2.90 | 0.00 | Bal.*¹ | 0.93 | 1.00 | 0.25 | 0.12 | 0.00 | 1.84 | 35.3 |
| Example 2 | 26.00 | 0.00 | 6.70 | 0.00 | Bal. | 4.00 | 1.14 | 0.11 | 0.41 | 0.00 | 3.84 | 669.0 |
| Example 3 | 29.30 | 0.00 | 0.70 | 0.00 | Bal. | 0.50 | 0.98 | 0.29 | 0.56 | 0.00 | 3.05 | 22.3 |
| Example 4 | 30.10 | 0.00 | 0.00 | 0.50 | Bal. | 1.13 | 0.95 | 0.35 | 0.24 | 0.00 | 2.34 | 11.5 |
| Example 5 | 31.20 | 0.00 | 0.00 | 1.10 | Bal. | 2.45 | 1.05 | 0.47 | 0.33 | 0.00 | 3.51 | 17.3 |
| Example 6 | 24.30 | 3.80 | 3.50 | 0.00 | Bal. | 3.37 | 1.01 | 0.52 | 0.28 | 0.00 | 1.78 | 115.7 |
| Example 7 | 21.90 | 5.30 | 5.10 | 0.00 | Bal. | 0.25 | 0.93 | 0.31 | 0.47 | 0.00 | 2.65 | 254.0 |
| Example 8 | 18.60 | 10.60 | 1.80 | 0.00 | Bal. | 1.86 | 1.08 | 0.16 | 0.15 | 0.00 | 3.17 | 35.0 |
| Example 9 | 14.70 | 13.20 | 0.00 | 0.90 | Bal. | 2.01 | 1.02 | 0.44 | 0.51 | 0.00 | 1.45 | 21.5 |
| Example 10 | 9.50 | 17.40 | 0.00 | 2.00 | Bal. | 1.36 | 1.18 | 0.56 | 0.39 | 0.00 | 2.96 | 39.0 |
| Example 11 | 27.63 | 4.69 | 2.50 | 0.00 | Bal. | 0.94 | 1.02 | 0.23 | 0.11 | 0.64 | 1.92 | 24.0 |
| Comparative Example 1 | 27.40 | 0.00 | 2.90 | 0.00 | Bal. | 0.92 | 0.98 | 0.22 | 0.12 | 0.00 | 34.16 | 1.3 |
| Comparative Example 2 | 29.00 | 5.70 | 1.30 | 0.00 | Bal. | 0.50 | 1.05 | 0.22 | 0.10 | 0.00 | 29.30 | 0.1 |
| Comparative Example 3 | 26.60 | 0.00 | 2.60 | 0.00 | Bal. | 0.50 | 1.05 | 0.21 | 0.10 | 0.00 | 30.78 | 0.008 |
| Comparative Example 4 | 22.40 | 0.00 | 7.00 | 0.00 | Bal. | 0.73 | 1.05 | 0.21 | 0.10 | 0.00 | 29.92 | 0.004 |
| Comparative Example 5 | 27.30 | 0.00 | 3.00 | 0.00 | Bal. | 1.00 | 1.00 | 0.20 | 0.10 | 0.00 | 31.14 | 0.8 |

*¹Bal: balance (100 mass % − total mass % of other elements)
*²Ratio of content (b) of Dy + Tb in boundary phase to content (a) of Dy + Tb in main phase

TABLE 4

| | Magnetic remanence Br (T) | Coercivity HcJ (kA/m) |
|---|---|---|
| Example 1 | 1.45 | 1696 |
| Example 2 | 1.40 | 2373 |
| Example 3 | 1.44 | 1305 |
| Example 4 | 1.43 | 1320 |
| Example 5 | 1.38 | 1406 |
| Example 6 | 1.40 | 1807 |
| Example 7 | 1.38 | 2090 |
| Example 8 | 1.43 | 1499 |
| Example 9 | 1.44 | 1380 |
| Example 10 | 1.42 | 1576 |
| Example 11 | 1.45 | 1703 |
| Comparative Example 1 | 1.42 | 1500 |
| Comparative Example 2 | 1.42 | 1321 |
| Comparative Example 3 | 1.43 | 1496 |
| Comparative Example 4 | 1.29 | 2355 |
| Comparative Example 5 | 1.40 | 1512 |

Table 4 clearly shows that the sintered magnets made of the R-TM-A-M-type alloy flakes of Examples had the magnet performance, Br and HcJ, both excellent and well-balanced, according to the Dy or Tb content, compared to the sintered magnets made of the alloys of Comparative Examples.

What is claimed is:

1. R-TM-A-M-type rare earth-containing alloy flakes of a composition consisting of:
   not less than 27.0 mass % and not more than 40.0 mass % R representing at least two elements selected from the group consisting of Y, Sc, and lanthanoid elements of atomic numbers 57 to 71, with Nd and at least one of Dy and Tb being essential;
   not less than 0.7 mass % and not more than 2.0 mass % A representing B, or B and C;
   not less than 0 mass % and not more than 3.0 mass % M representing at least one element selected from the group consisting of Al, Si, Ti, V, Cr, Mn, Ni, Cu, Zn, Ga, Zr, Nb, Mo, Ag, In, Sn, Hf, Ta, W, Pb, and Bi; and
   a balance TM representing Fe, or Fe and Co;
   wherein a content of Dy and Tb in R is not less than 0.1 mass % and not more than 10.0 mass %,
   wherein said alloy flakes have a structure having a $Nd_2Fe_{14}B$ main phase and a boundary phase,
   wherein a Fe content in said boundary phase is not more than 10 mass %, and
   wherein a ratio of a total content (b) of Dy and Tb in said boundary phase to a total content (a) of Dy and Tb in said main phase is higher than 1.0.

2. The alloy flakes according to claim 1 having an average thickness of not thinner than 0.01 mm and not thicker than 5.0 mm.

3. A method for producing the rare earth-containing alloy flakes of claim 1, said method comprising the steps of:
   (I) melting a raw material consisting of R' selected from the group consisting of Y, Sc, and lanthanoid elements of atomic numbers 57 to 64 and 67 to 71, with Nd being essential: A representing B, or B and C: M representing at least one element selected from the group consisting of Al, Si, Ti, V, Cr, Mn, Ni, Cu, Zn, Ga, Zr, Nb, Mo, Ag, In, Sn, Hf, Ta, W, Pb, and Bi: and TM representing Fe, or Fe and Co;
   (II) cooling and solidifying a melt of said raw material for preparing a precursor of master alloy flakes;
   (III) heat-treating said precursor of master alloy flakes obtained from step (II) for reducing the Fe content in a boundary phase in said precursor, thereby obtaining master alloy flakes;
   (IV) contacting at least one of a Dy supply source and a Tb supply source to said master alloy flakes; and
   (V) heat-treating, after said step (IV), for dispersing at least one of Dy and Tb in said master alloy flakes.

4. The method according to claim 3, wherein in said step (II), said melt of raw material is cooled and solidified into a thickness of not thinner than 0.01 mm and not thicker than 5.0 mm.

5. The method according to claim 3, wherein said heat-treating in step (III) is performed at not lower than 500° C. and not higher than 1000° C.

6. The method according to claim 3, wherein said Dy supply source or said Tb supply source is Dy metal, Tb metal, a halide of Dy, a halide of Tb, an oxide of Dy, an oxide of Tb, an organic acid salt of Dy, an organic acid salt of Tb, a hydride of Dy, or a hydride of Tb.

7. The method according to claim 3, wherein said step (IV) of heat-treating is performed at not lower than 500° C. and not higher than 1000° C.

8. A sintered magnet obtained by sintering a molded product of pulverized rare earth-containing alloy flakes of claim 1.

* * * * *